US006137347A

United States Patent [19]

[11] Patent Number: 6,137,347

[45] Date of Patent: Oct. 24, 2000

Gonzalez

[54] MID SUPPLY REFERENCE GENERATOR

[75] Inventor: David M. Gonzalez, Elgin, Ill.

[73] Assignee: Motorola, Ltd., Schaumburg, Ill.

[21] Appl. No.: 09/187,464

[22] Filed: Nov. 4, 1998

[51] Int. Cl.[7] .......... H03L 5/00

[52] U.S. Cl. .......... 327/538; 327/542; 327/543; 323/312; 323/315

[58] Field of Search .......... 327/538, 540, 327/541, 542, 543; 323/312, 313, 314, 315

[56] References Cited

U.S. PATENT DOCUMENTS

| | | | |
|---|---|---|---|
| 4,837,496 | 6/1989 | Erdi | 323/315 |
| 5,625,282 | 4/1997 | Kawahara | 323/315 |
| 5,719,522 | 2/1998 | Saitou et al. | 327/540 |
| 5,831,473 | 11/1998 | Ishii | 327/538 |
| 5,926,062 | 7/1999 | Kuroda | 327/513 |
| 5,945,873 | 8/1999 | Antone et al. | 327/541 |

*Primary Examiner*—Timothy P. Callahan
*Assistant Examiner*—An T. Luu
*Attorney, Agent, or Firm*—Randall S. Vaas; Michael C. Soldner

[57] ABSTRACT

A mid supply reference generator (100, 200, 300) has a first resistance element (106, 206) coupled to a first supply. A second resistance element (108, 208) is coupled to a second supply. A third resistance element (110, 210) is coupled to the second supply A first transistor element (116, 216) is coupled to the first resistance element and the second resistance element, the first transistor element coupled between the first and second resistance element such that the first and second resistance elements provide a reference voltage drop from the same current level. A second transistor element is (120, 220) coupled between the first supply and the mid supply output, the second transistor element to drive the output providing a desired mid supply potential. A third transistor element (118,218) is coupled to the mid supply output and to the third resistance element, the third transistor element and the first transistor element being connected such that they generate proportional currents.

3 Claims, 1 Drawing Sheet

MID SUPPLY REFERENCE GENERATOR

FIELD OF THE INVENTION

The present invention pertains to voltage reference generating circuitry, and more particularly to reference voltage generators for generating a voltage between the high and low supply potentials, and still more particularly to a reference signal generator which is particularly well suited to battery powered devices.

BACKGROUND OF THE INVENTION

Mid supply reference voltage generators are typically made up of a voltage divider and an op-amp. The voltage divider includes impedance elements, such as resistors, and generates a voltage level proportional to the ratio of these impedance elements. The op-amp is configured in a unity gain feed back arrangement connected to the voltage divider.

In these circuits, if the supply current needs to be low, the voltage divider is constructed from large resistors or long-channel MOSFET elements, both of which take up considerable silicon area on an integrated circuit (IC). Additionally, the high output resistance of the voltage divider results in significant thermal noise. The voltage divider is also susceptible to noise coupled from adjacent on-chip circuitry.

These problems can be partially eliminated through the use of a bypass capacitor. However the use of a bypass capacitor is limited by the silicon area available and the stabilization time requirements of the application in which the mid supply voltage generator is employed. Additionally, use of a capacitor increases the time period necessary for the voltage generator to stabilize. This occurs because the bypass capacitor, with the output resistance of the voltage divider, creates a long time constant which significantly limits the applications that can employ the voltage divider For example, in battery powered devices such as cellular radiotelephone products, palm top devices and laptop computers, settling time upon "power-up", or exiting power save mode, is an important characteristic of a supply voltage generator. In these applications, a large time constant is not desirable.

Use of an op-amp also has several disadvantages. Op-amps have an offset voltage which, for most designs, varies with temperature. Op-amps also draw a significant supply current. Op-amps employ a biasing circuit which also draws a significant amount of current. These high current drains are problematic in battery powered devices, wherein it is desirable to have the lowest possible current drain to obtain long battery life.

In a complex mixed signal IC, several different mid supply references may be required, entailing a variety of load impedances and currents. Usually there is no single op-amp that will satisfy all of the requirements of the op-amp in such an application economically. As a result, custom op-amps, having desired frequency compensation and bias circuitry will have to be designed for each application's requirements.

Thus it is time consuming to develop, and expensive to provide, a suitable mid supply voltage generator, especially in battery powered devices. Accordingly there is a need for a mid supply voltage generator that does not have the disadvantages of existing circuits.

DETAILED DESCRIPTION OF THE DRAWINGS

Figure 1:
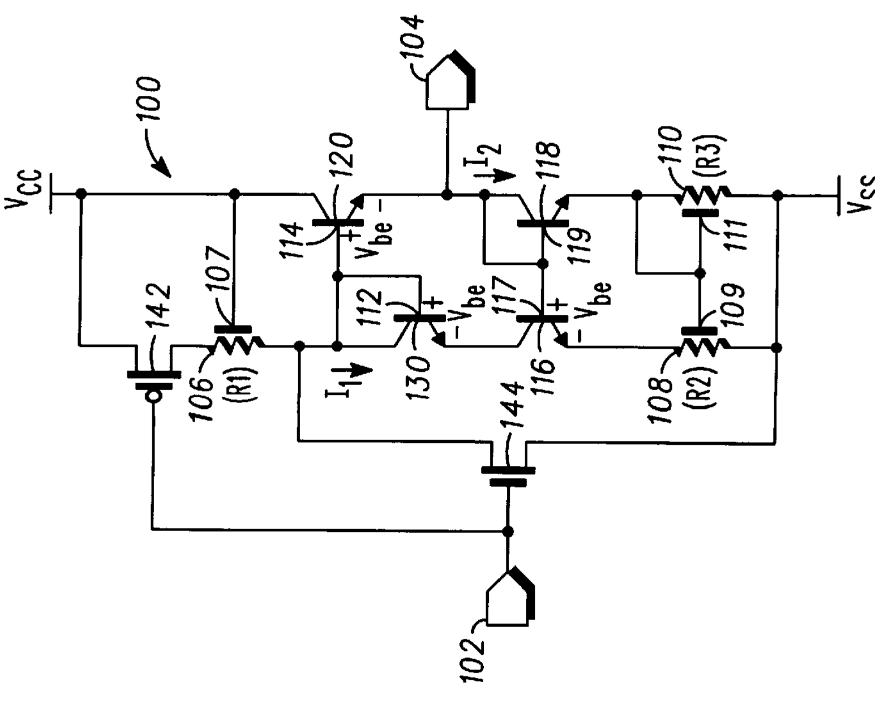
FIG. 1 is a circuit schematic illustrating a mid supply reference generator.

A mid supply voltage generator 100 (FIG. 1) is connected between a high potential supply rail Vcc and a low potential supply rail Vss. For example, Vcc may be 3 Volts and Vss may be circuit ground. Mid supply voltage generator 100 has an input for receipt of an "ON/OFF" control signal. The mid supply reference is generated at output 104.

The mid supply reference generator 100 includes a resistance element 106 connected to Vcc through a switch 142. Resistance element 106 is connected to a collector of a transistor element 130. The emitter of transistor element 130 is connected to the collector of a transistor element 116. The emitter of transistor element 116 is connected through a resistance element 108 to Vss.

The mid supply reference generator also includes a transistor element 120 having its collector connected to Vcc and its emitter connected to output 104. The base 114 of transistor element 120 is connected to the base 112 and the collector of transistor element 130. A transistor element 118 has its collector and base 119 connected to output 104. The emitter of transistor element 118 is connected to Vss via a resistance element 110 (an emitter resistor). The base 119 of transistor element 118 is connected to the base 117 of transistor element 116.

The resistance elements 106 and 108 provide a voltage drop of a desired magnitude, and may for example have the same impedance value, such that they drop an equal voltage to set a center voltage at the output. Alternatively, the resistors 106 and 108 can be chosen to have different values to select a voltage level other than one half of the voltage difference between Vss and Vcc. In the implementation described herein, the resistance elements 106, 108 and 110 are matched, such that currents I1 and I2 are equal, and output 104 has a potential that is one-half of Vcc when Vss is ground.

Transistor element 120 provides an emitter-follower for output 104 to obtain the desired output impedance characteristics. The transistor element 120 also provides a base-emitter voltage drop (Vbe) between resistance element 106 and output 104. Transistor elements 116 and 118 are connected to the emitter resistance elements 108 and 110, respectively. As mentioned above, the resistance elements 108 and 110 are matched, such that currents I1 and I2 are the same.

In operation, the transistor element 116 controls the current through resistance element 108. The transistor elements 116 and 120 are matched such that their base-emitter voltage drops are equal. Because the transistor elements 116, 118, 120 and 130 hold the current through resistor elements 106 and 108 to an equal value, if the resistance elements 106 and 108 are matched a center voltage is produced This occurs because the voltage across resistor 108 plus the base-emitter voltage of transistor element 116 will equal the voltage drop across resistor 106 plus the base-emitter voltage drop across transistor element 120. The voltage at output 104 will then be ½(Vcc−Vss)+Vss. Where Vss is ground, the voltage at output 104 is Vcc/2.

Transistor element 130 is an optional transistor element. In an implementation using NPN transistors, transistor element 130 is desirable. It is configured to provide a diode drop between the base 114 of transistor element 120 and the collector of transistor element 116. This helps to equalize the collector-emitter voltage of transistor elements 116 and 118, which helps equalize the currents I1 and I2, which in turn helps to equalize the base-emitter voltages of transistor elements 116 and 120, resulting in a precise output voltage.

This mid supply reference generator 100 can be used for most analog signal processing circuits which need a common-mode, mid supply voltage. The transistor elements 116, 118, 120 and 130 are preferably bipolar junction transistors, and more particularly NPN bipolar transistors. The circuit can alternatively be built using lateral PNP transistor elements or CMOS transistor elements.

The resistance elements 106, 108 and 110 can be implemented using any suitable resistor, such as high sheet resistors. It is envisioned that the mid supply reference voltage generator will be implemented on an integrated circuit. Accordingly, the resistance elements can be P-type semiconductor material in an N-well. The N-wells 107, 109, and 111 of resistance elements 106, 108 and 110, respectively, are biased positive relative to their respective P-type resistor. Those skilled in the art will recognize that the resistance elements can be implemented using any other suitable resistor.

The mid supply reference generator also includes optional switches 142 and 144. Switch 142 is connected between the high supply potential Vcc and one terminal of resistance element 106. Switch 144 connects the other terminal of resistance element 106 to Vss. which is circuit ground in the implementation example described. The switches 142 and 144 are preferably provided by metal oxide semiconductor field effect transistor (MOSFET) elements. By providing a P-channel MOSFET element 142 and an N-channel MOSFET element 144, the switches will be alternately enabled responsive to a common binary control signal. The MOSFET switches are controlled to selectively present an open circuit and a closed circuit. The MOSFET element 142 is effectively a short providing no substantial voltage drop, when it is conducting, and an open circuit providing isolation, when it is OFF. Similarly, MOSFET 144 provides a short in parallel with the transistor elements 116,130, and resistance element 108, when conducting, and an open circuit when it is OFF.

Switches 142 and 144 are desirable, in a battery powered device. These switches are controlled to turn the mid supply reference generator 100 OFF, such as during a standby mode. To turn the mid supply reference generator 100 OFF, switch 142 is open and switch 144 is closed. When the mid supply voltage generator is operating, the switch 142 is closed and switch 144 is open. The circuit 100 thus draws an extremely small current when it is OFF.

The reference voltage generated at output 104 is determined as follows. The voltage at output 104 is set by two voltages. One of the voltages is the sum of the voltage across the drain and source of switch 142, plus the voltage across resistor 106, plus the base-emitter voltage drop of transistor element 120. The other voltage is the sum of the base-emitter voltage of transistor element 116 plus the voltage drop across resistance element 108. The voltage across switch 142 is essentially 0 when the switch is closed. The base-emitter voltages of transistor elements 116 and 120 are equal, as the transistor elements are matched and have equal currents. The voltage at output 104 is thus set by selection of the resistance elements 106 and 108. If they are matched, the reference voltage will be at the center of the supply rails Vcc and Vss.

By selecting different impedance ratios, other output potentials can be provided at output 104. However, using resistance values that are not equal will not be precise and will result in an output voltage that varies with temperature because the output potential depends on Vbe, which varies over temperature. In particular, $$Vout=(Vcc*R1/(R1+R2))+Vbe*(1-2R1/(R1+R2)).$$

If R1 and R2 are equal, Vbe is multiplied by zero, and the variation of Vbe with temperature does not impact Vout. Thus, in some applications where Vcc is large and a small variation in Vbe is tolerable, the mid supply reference voltage generator 100 can be used to output potentials other that a center voltage. In other environments, where Vcc is small, and precision is required, the invention provides a precise center potential, which is highly desirable for logic circuitry in some applications.

The following derivation illustrates how this mid supply reference generator 100 produces a mid supply voltage reference and how its accuracy depends on resistor and Vbe matching:

$$Vout=I_1R_2+Vbe_2=Vcc-I_1R_1Vbe_3$$

wherein $Vbe_2$ is the base-emitter voltage drop of transistor element 116, and $Vbe_3$ is the base-emitter voltage drop of transistor element 120. This can be rewritten as:

$$Vout=(Vcc+Vbe_2*R_1/R_2-Vbe_3)/(1+R_1/R_2)$$

Letting $R=(R_1+R_2)/2$ and $\Delta R=R_1-R_2$ and $Vbe_2=Vbe_3=Vbe$:

$$Vout=[Vcc*(R-\Delta R/2)+Vbe*\Delta R]/2*R$$

$$Vout/(Vcc/2)=1+(Vbe/Vcc-0.5)*\Delta R/R$$

For Vbe=0.75 and Vcc=2.775, $$Vout/(Vcc/2)=1-0.23*\Delta R/R$$

For example, an output voltage error of 0.12% would be caused by a 0.5% mismatch of resistors $R_1$ and $R_2$. This is highly desirable, as for prior art voltage dividers, a 0.5% mismatch results in a 0.5% error. For ideal resistors, the Vout variation due to $\Delta Vbe=Vbe_2-Vbe_3$ is:

$$Vout/(Vcc/2)=1+\Delta Vbe/Vcc.$$

The overall equation for Vout at room temperature is thus:

$$Vout=Vcc/2*(1+\Delta Vbe/Vcc+0.23*\Delta R/R).$$

The supply current to the mid supply reference generator 100, is Icc, which is the current drawn from the supply Vcc. When $R_1=R_2=R_3$, the supply current drawn by this circuit is equal to:

$$Icc=(Vcc-2*Vbe)/R$$

where R is the impedance of each of the resistors R1, R2 and R3.

Low output resistance is accomplished with minimal circuit complexity. The output resistance, Rout, is small, and assuming zero average load, the output resistance is approximately:

$$Rout=2*Vt*R/(Vcc-2*Vbe)$$

where Vt is a constant. For R=64k, Vcc=2.775, Vbe=0.75 and Vt=26mV, then Rout=2.6k and Icc=20A.

Additionally, adjustments can be made for load current. R3 is normally equal to R1 and R2, but it should be adjusted if the average load current is non-zero or the peak current flowing into the output is large. The adjustment can be made as follows:

R3 is set based on the average current flowing into the mid supply reference.

$$R3=R\Pi(Vcc/2-Vbe)/II_{avg}$$

where the symbol: II means parallel combination and $II_{avg}$ is the average load current. Then R3 is checked to insure that it meets the following condition:

$$R3\leqq(Vcc/2-Vbe)/II_{max}$$

where $II_{max}$ is the peak current supplied into the output of the mid supply reference.

A noise performance comparison was made between the invention and a prior mid supply reference generators. The prior reference circuit uses a voltage divider and an op-amp. The voltage divider was chosen so that a fair noise comparison would be made with mid supply reference circuit 100. In particular, the voltage divider was chosen to have the same resistor values and diodes as the present mid supply reference generator when making the comparison.

The data below is total noise voltage, integrated over a frequency range from 1 Hz to 1 GHz. The total noise generated by the invention is less than the noise generated by the voltage divider alone in the prior art circuit.

| Implementation | Vdiv | Opamp | Total |
|---|---|---|---|
| Prior circuit | 246.1 nV | 55.5 nV | 301.6 nV |
| Invention | | | 229.5 nV |

The stability of the circuit was also improved. The low frequency open loop gain of the circuit according to FIG. 1 is slightly less than unity and the feedback is negative. As frequency rises, the gain in dB never goes positive. The excess phase shift does reach 180°, but not until the gain has dropped considerably. For example, with a 10 pF load, the gain margin was found to be 30 dB at 30 MHz. The gain margin is actually better with larger capacitors. The circuit shown in FIG. 1, proved stable in simulations using load capacitors for 1 fF to 10 uF.

Thus it can be seen that the mid supply reference generator 100 has a number of significant benefits relative to prior circuits. It has lower supply current, which is set by the designer, based on the requirements of the application. A typical version of this circuit draws 20 uA of supply current, as compared to earlier versions which draw approximately 250 uA. The battery-save mode can be implemented using switches 142 and 144, which lower the current drains to picoAmps in the standby mode.

The mid supply reference generator 100 produces less output noise. The thermal noise, generated by voltage-divider resistors and op-amp circuit components, in prior circuits has been largely eliminated by this circuit. This improvement was largely do to elimination of the op-amp.

The mid supply reference generator 100 has faster turn-on time. Traditional, more complex solutions make the transition from battery-save mode to normal mode slowly. This is because of nodes that charge with long-time constants, and op-amp and bias generator circuits that require much time to stabilize. The present circuit has very rapid turn on.

The mid supply reference generator 100 uses less die area, since this circuit has fewer and smaller components, and needs no compensation capacitors.

The mid supply reference generator 100 presents less risk to designers because there are no stability or other op-amp performance issues.

The mid supply reference generator 100 requires less design time because no op-amp customization is required. The resistor values and widths are calculated based on the requirements of supply current, output resistance, current handling and voltage accuracy.

Figure 2:
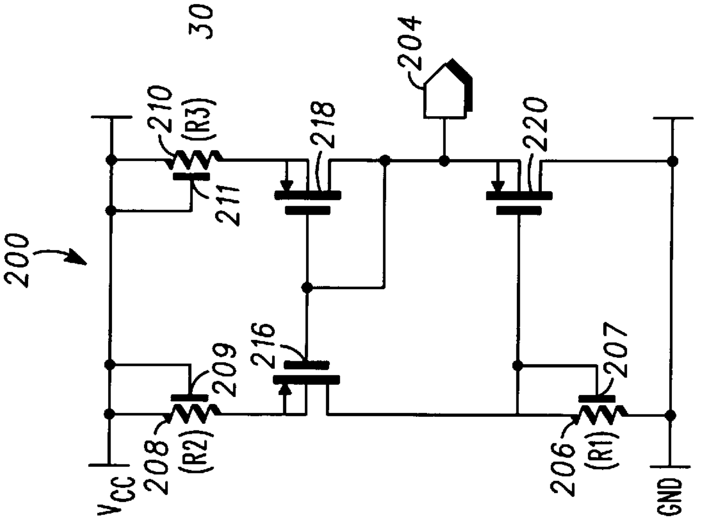
FIG. 2 is a circuit schematic illustrating an alternate embodiment of the mid supply reference generator according to FIG. 1.

As mentioned above, a mid supply reference generator 200 can be implemented with C-MOS FET elements, as illustrated in FIG. 2. The resistance elements 206 and 208 are selected such that the circuit produces the desired output voltage. It is preferable that the resistance elements have equal values for uses that require optimum precision. The resistance element 210 together with the resistance element 208, and MOSFET elements 216 and 218, provide a current mirror. The output is driven by MOSFET element 220.

The ON/OFF switches 142 and 144 of FIG. 1, and the diode drop transistor element 130 in FIG. 1, are not needed, but can be advantageously employed to improve performance of this embodiment. In the mid supply reference generator 200, the equivalent of diode 130 would be implemented using a MOSFET element instead of a bipolar element. The operation of mid supply reference generator 200 (FIG. 2) is otherwise analogous to the mid supply reference generator 100 (FIG. 1).

Those skilled in the art will recognize that the mid supply reference generator 200 has some disadvantages over mid supply reference generator 100. In particular the for mid supply reference generator 200 the output impedance, Rout, will be higher and the silicon area will be larger However, the mid supply reference generator 200 is highly desirable in applications that exclusively utilize CMOS fabrication processes.

Figure 3:
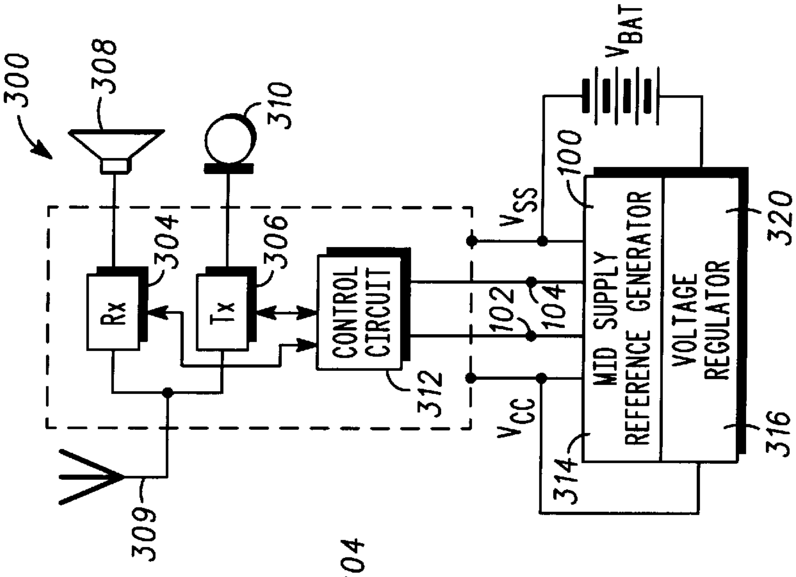
FIG. 3 is a circuit schematic in block diagram form illustrating a battery powered device incorporating the mid supply reference generator.

A battery powered wireless communication device 300 is illustrated in FIG. 3. The wireless communication device 300 includes a microphone 310 connected to an antenna 309 via a transmitter 306, and a speaker 308 connected to antenna 309 through receiver 304. The transmitter and receiver 304, 306, are controlled by control circuit 312. The control circuit 312 of the wireless communication device 300 is powered by Vcc and Vss. Vcc is regulated by voltage regulator 320, which produces the regulated voltage from battery $V_{BAT}$.

The mid supply reference generator 100 produces a mid supply reference at output 104. The mid supply reference control input 102 is connected to control circuit 312. The control circuit uses the mid supply voltage provided from circuit 100. Additionally, the control circuit 312 generates the control signals to turn the mid supply reference generator 100 OFF when the wireless communication device is in standby mode, thereby greatly reducing the average current drain of the communication device 300. The mid supply reference generator 100 will quickly stabilize when it is turned ON.

Thus, it can be seen that an improved mid supply reference generator is disclosed. The output resistance and current capability can be set by changing resistor values. The resistance elements are selected to be as low as possible, to obtain a low output impedance, and as high as possible to reduce the current drain while in operation. This circuit is not sensitive to loading capacitance, since it is inherently stable. A great deal of design time and effort is saved by not having to provide op-amp optimization, including frequency compensation. Additionally, the circuit can be easily replicated in a circuit to provide additional output voltages having different values or different impedance requirements.

What is claimed is:

1. A mid supply reference generator, having a mid supply output, comprising:

a first resistance element coupled to a first supply;

a second resistance element coupled to a second supply;

a third resistance element coupled to the second supply;

a first transistor element coupled to the first resistance element and the second resistance element, the first transistor element coupled between the first and second resistance element such that the first and second resistance elements provide a reference voltage drop from the same current level;

a second transistor element coupled between the first supply and the mid supply output, the second transistor element to drive the mid supply output providing a desired mid supply potential;

a third transistor element coupled to the mid supply output and to the third resistance element, the third transistor element and the first transistor element being connected such that they generate proportional currents; and a first transistor switch coupled between the first supply and the first resistance element, and a second transistor switch coupled between the first resistance element and the second supply, wherein the first and second transistor switches are used to turn the supply reference generator ON and OFF.

2. The mid supply reference generator as defined in claim 1, wherein the first and second switches include field effect transistor elements.

3. A mid supply reference generator for generating a reference voltage between a first supply potential and a second supply potential, comprising:

a first switch connected to the first supply potential;

a first resistance element coupled to the first switch;

a first transistor element, the first resistance element connected between the first switch and the first transistor element;

a second transistor element, the first transistor element connected between the first resistance element and the second transistor element;

a second resistance element coupled between the second transistor element and the second supply;

a third transistor element coupled between the first supply potential and an output of the mid supply reference voltage output at the output;

a fourth transistor element the fourth transistor element connected to the output;

and a third resistance element, the third resistance element connected between the fourth transistor element and the second supply potential;

and wherein the bases of the first and third transistor elements are connected, the bases of the second and fourth transistor elements are connected, and the collector of the fourth transistor element is connected to the base of the fourth transistor element.

* * * * *